(12) United States Patent
Dobyns et al.

(10) Patent No.: US 9,297,834 B2
(45) Date of Patent: Mar. 29, 2016

(54) TIME-DOMAIN SEARCHING IN A TEST AND MEASUREMENT INSTRUMENT

(75) Inventors: Kenneth P. Dobyns, Beaverton, OR (US); Gary J. Waldo, Hillsboro, OR (US)

(73) Assignee: TEKTRONIX, INC., Beaverton, OR (US)

(*) Notice: Subject to any disclaimer, the term of this patent is extended or adjusted under 35 U.S.C. 154(b) by 1142 days.

(21) Appl. No.: 12/856,491

(22) Filed: Aug. 13, 2010

(65) Prior Publication Data

US 2012/0039374 A1 Feb. 16, 2012

(51) Int. Cl.
*H04B 3/46* (2015.01)
*G01R 13/02* (2006.01)

(52) U.S. Cl.
CPC ........ *G01R 13/0218* (2013.01); *G01R 13/0236* (2013.01); *G01R 13/0272* (2013.01)

(58) Field of Classification Search
CPC .......... G01R 13/0218; G01R 13/0272; G01R 13/0236
USPC ............ 324/76.39, 76.82, 85, 86, 103 R, 119
See application file for complete search history.

(56) References Cited

U.S. PATENT DOCUMENTS

| | | | | |
|---|---|---|---|---|
| 4,802,098 A * | 1/1989 | Hansen | ............... | G01R 13/345 315/367 |
| 5,959,607 A * | 9/1999 | Montijo | ............... | 345/440.1 |
| 6,292,128 B1 * | 9/2001 | Tsui et al. | ............... | 342/13 |
| 6,340,883 B1 * | 1/2002 | Nara et al. | ............... | 324/76.78 |
| 6,615,148 B2 * | 9/2003 | Pickerd | ............... | G01R 13/345 702/125 |
| 6,693,576 B2 * | 2/2004 | Azinger | ............... | 341/155 |
| 7,298,129 B2 * | 11/2007 | Bernard | ............... | 324/76.22 |
| 2004/0184554 A1 * | 9/2004 | Pauly et al. | ............... | 375/295 |
| 2006/0015277 A1 * | 1/2006 | Bernard et al. | ............... | 702/76 |
| 2008/0082278 A1 * | 4/2008 | Tan et al. | ............... | 702/76 |
| 2010/0007329 A1 * | 1/2010 | Kuhwald et al. | ............... | 324/76.43 |
| 2010/0204937 A1 * | 8/2010 | Harwood | ............... | 702/66 |
| 2011/0149749 A1 * | 6/2011 | Ogata et al. | ............... | 370/252 |

OTHER PUBLICATIONS

Fundamentals of Real-Time Spectrum Analysis, Tektronix, Feb. 2008.*

* cited by examiner

*Primary Examiner* — Tung X Nguyen
*Assistant Examiner* — Adam Clarke
(74) *Attorney, Agent, or Firm* — Thomas F. Lenihan; Marger Johnson

(57) ABSTRACT

Embodiments of the invention include devices and methods for searching IQ-based time-domain traces for events, marking the events, and analyzing intervals of interest at or around the events on a display unit of a test and measurement instrument. The test and measurement instrument can include an input terminal to receive an RF signal, an ADC to digitize the RF signal, a digital downconverter to produce I (in-phase) and Q (quadrature) baseband component information from the digitized RF signal, an acquisition memory to acquire and store a record, a trace generation section to generate one or more IQ-based time-domain traces, and a search unit to scan the IQ-based time-domain traces for one or more events. The search unit can locate and mark the events for display on a display unit of the test and measurement instrument.

17 Claims, 5 Drawing Sheets

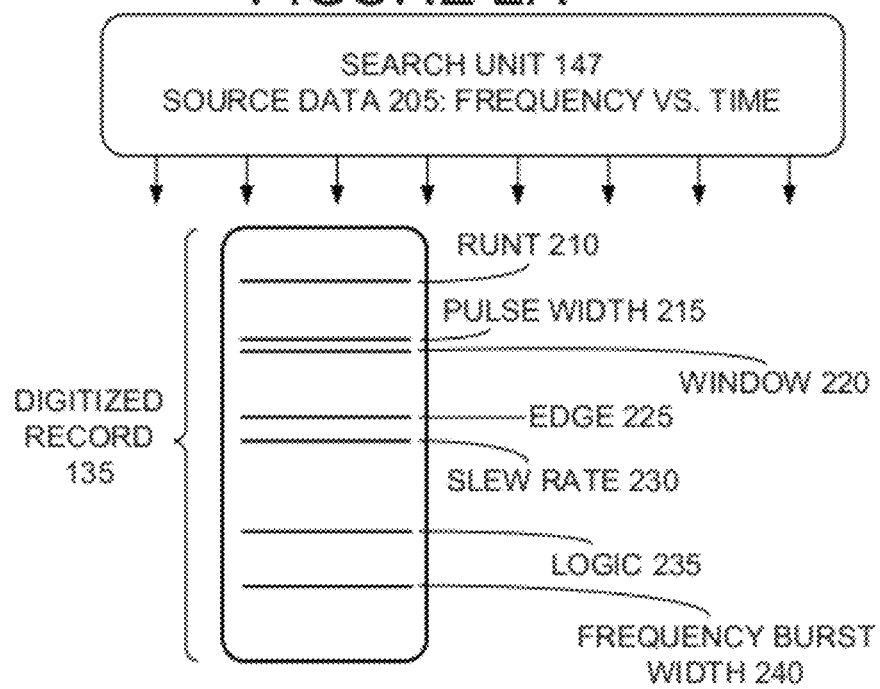
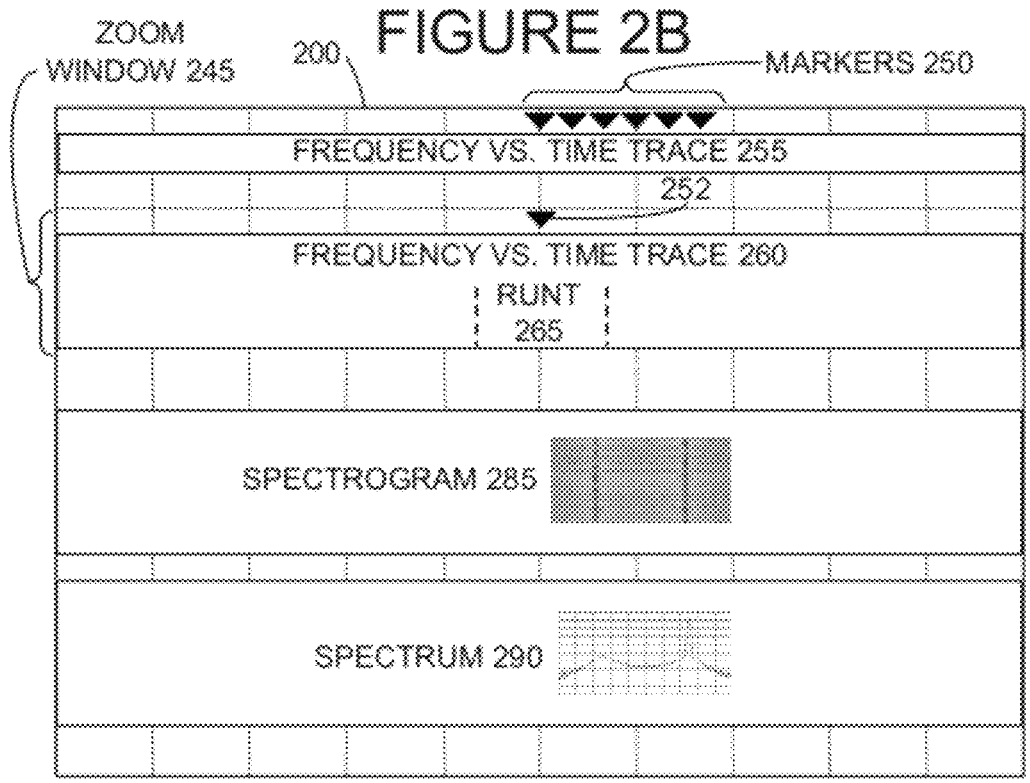

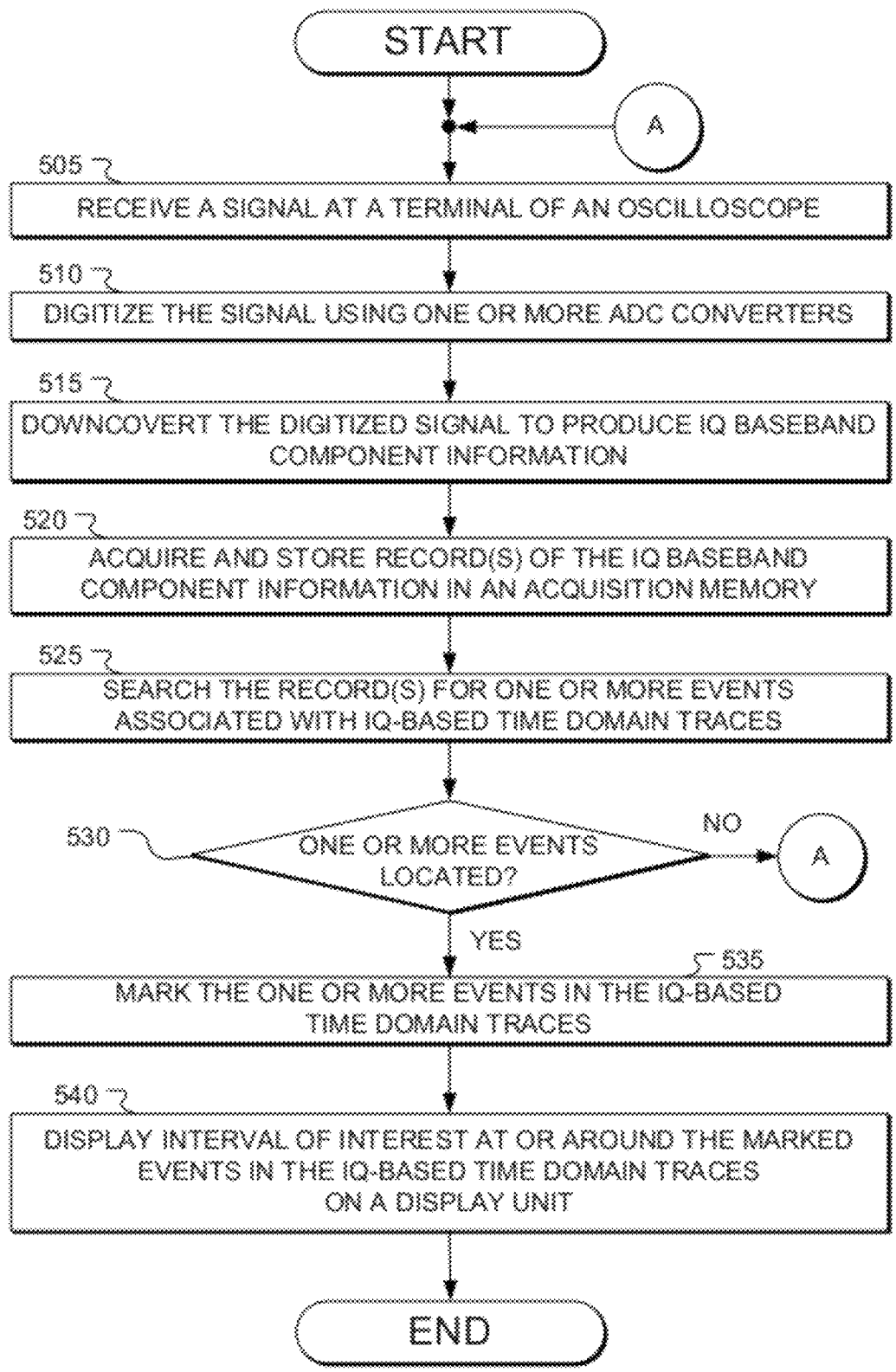

TIME-DOMAIN SEARCHING IN A TEST AND MEASUREMENT INSTRUMENT

BACKGROUND

Radio Frequency (RF) transmissions are becoming increasingly ubiquitous in today's wirelessly connected world. For instance, cell phone usage is rapidly increasing around the world, high-speed data networks are spreading, and home wireless and wide-area networks are becoming commonplace. In the midst of these and other similar advances, now more than ever, it is crucial that test and measurement instruments provide effective search capabilities so that an accurate picture of what has happened can be reconstructed and provided to field personnel such as test engineers and other qualified technicians.

RF carrier signals can transmit information in a variety of ways based on variations in the amplitude, frequency, or phase of the carrier. Governments typically apportion radio frequency ranges to be used for different purposes. As a result, certain devices are permitted to operate only within predetermined bands. Such limitations result in ever more complex and efficient methods for adapting to these constraints and abiding by accepted communications standards. For example, many modern transmission systems use frequency hopping and phase modulation to conform to communication standards and to provide improved functionality and interoperability among different devices competing for similar resources.

Most modern Real Time Spectrum Analyzers (RTSAs) can receive the RF signals and store a record of captured data associated with the signals. However, using conventional techniques it is difficult or impossible to search and isolate certain aspects of these signals, such as time-domain events in the RF data. There does not exist any method for searching through captured RF signal data for relevant time-domain phenomenon. Therefore, a need remains for new devices and methods for searching previously stored records of RF signal data for time-domain events.

SUMMARY

Embodiments of the subject invention provide search techniques for searching time-domain characteristics of previously stored radio frequency (RF) signal data. The subject apparatus, system, and method receive, digitize, and downconvert RF signals to produce I (in-phase) and Q (quadrature) baseband component information from the digitized RF signals. An acquisition memory acquires and stores one or more records of the digitized I and Q baseband component information associated with the RF signals. A trace generation section generates one or more IQ-based time-domain traces, and a search unit scans the one or more IQ-based time-domain traces for one or more time-domain events.

In some example embodiments of the invention, the search unit is configured to locate and mark one or more time-domain events in the previously stored IQ-based time-domain traces. For example, the search unit can locate and mark a runt or an illegal state in a frequency-versus-time trace. Other examples include the search unit locating and marking setup-and-hold events, window events, slew rate events, or pulse width events, in the IQ-based time-domain traces, among other possibilities. The IQ-based time-domain traces can include, for example, a phase-versus-time trace, a frequency-versus-time trace, an amplitude (i.e., power-versus-time) trace, or demodulated data, among other suitable time-domain traces and data. In addition, the search unit can locate and mark events associated with individual traces of the I and Q baseband component information. In other words, the search unit can directly scan an individual trace (i.e., I-versus-time trace) of the I baseband component information, and/or directly scan an individual trace (i.e., Q-versus-time trace) of the Q baseband component information. The display unit is adapted to display intervals of interest at or around the marked events.

BRIEF DESCRIPTION OF THE DRAWINGS

FIG. 2A illustrates the search unit of FIG. 1 having source data of frequency-versus-time, and a digitized record(s) including a variety of time-domain events that are scanned and identified by the search unit.

FIG. 2B illustrates a simplified display including a frequency-versus-time trace, together with a spectrogram and/or a spectrum of RF signals received by a test and measurement instrument, in accordance with an example embodiment of the invention.

FIG. 5 is a flow diagram illustrating a technique for searching IQ-based time-domain traces according to some embodiments of the invention.

DETAILED DESCRIPTION

Figure 1:
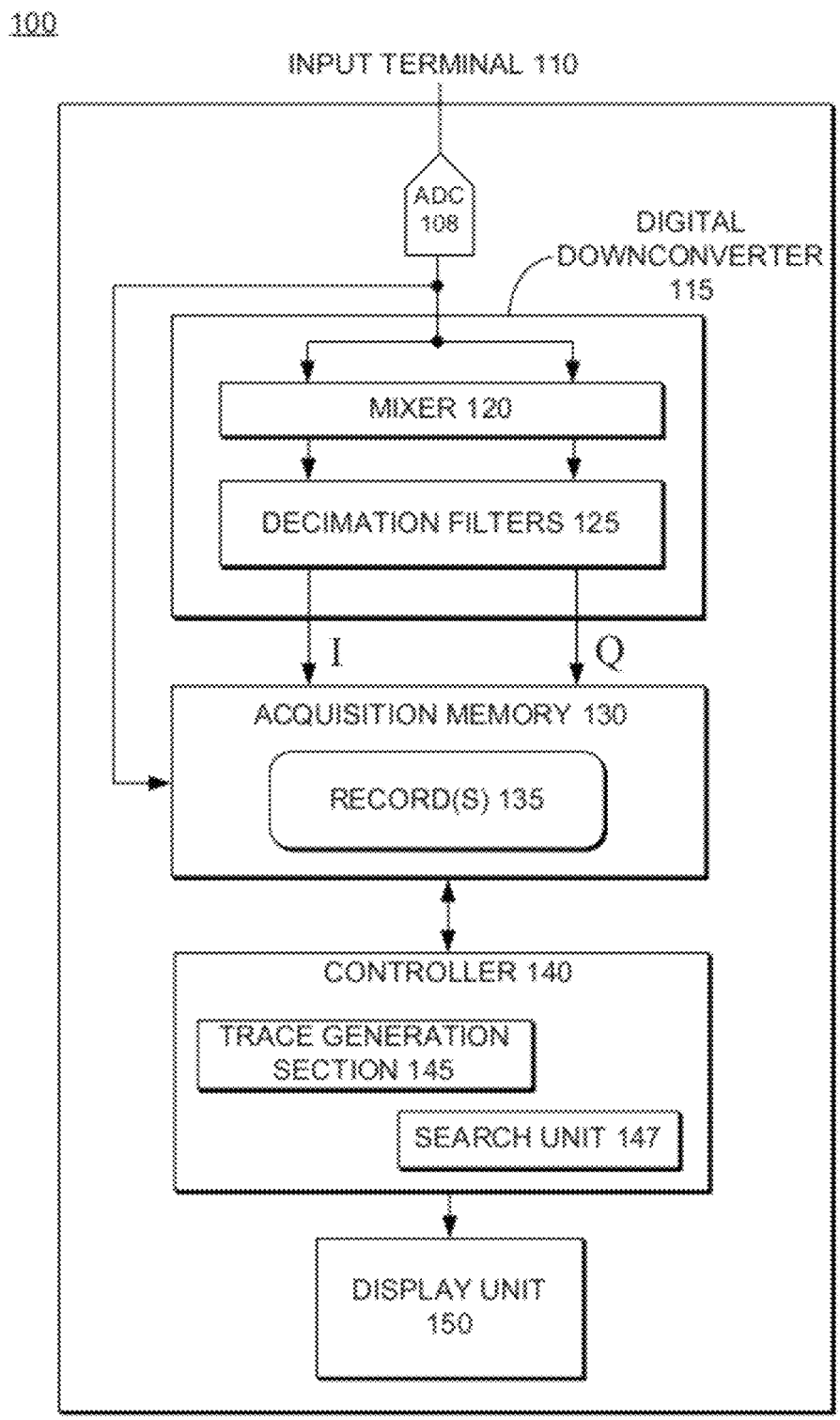
FIG. 1 illustrates a block diagram of a test and measurement instrument including an analog-to-digital converter (ADC), a digital downconverter, an acquisition memory to store one or more records, a controller including a trace generation unit and a search unit, and a display unit, according to an example embodiment of the invention.

FIG. 1 illustrates a block diagram of a test and measurement instrument 100 including an analog-to-digital converter (ADC) 108, a digital downconverter 115, an acquisition memory 130, a controller 140 including a trace generation section 145 and a search unit 147, and a display unit 150, according to an example embodiment of the invention. The test and measurement instrument 100 can be a digital oscilloscope, a Real Time Spectrum Analyzer (RTSA), or other suitable measurement device. For the sake of brevity and consistency, but not limitation, the test and measurement instrument will generally be referred to herein as an oscilloscope.

The oscilloscope 100 may have multiple channels or inputs, such as input terminal 110, suitable for use with various embodiments as described herein. Although the oscilloscope may have a single input terminal 110, inventive aspects described are equally applicable to an oscilloscope having four inputs, or any number of inputs. While components of the oscilloscope 100 are shown to be directly coupled to each other, it should be understood that the oscilloscope 100 can include a variety of other circuit or software components, inputs, outputs, and/or interfaces, which are not necessarily shown, but that are disposed between or otherwise associated with the illustrated components of oscilloscope 100.

An electrical signal under test, preferably an RF signal, is received at the input terminal 110. The RF signal can be converted to an analog intermediate frequency (IF) signal that is filtered prior to being digitized by the ADC 108. However, reference herein will generally be made to an "RF signal" or "RF signals" and it should be understood that such reference can include one or more RF signal, or, one or more IF signal derived from the RF signal.

The ADC 108 is structured to digitize the RF signal under test. The digital downcoverter 115 may be operatively coupled to the ADC 108, although it need not be directly coupled thereto. The downconverter 115 receives the digitized RF signal, and produces I (in-phase) and Q (quadrature) baseband component information from the digitized RF signal. More specifically, mixer 120 numerically multiplies a sine and cosine with the digitized RF signal, thereby generating the I and Q component information, which contains all of the information present in the original RF signal. The signal component data can thereafter be decimated using the decimation filters 125, which digitally filters and reduces the number of samples and noise associated with the signals.

An acquisition memory 130 is operatively coupled to the digital downconverter 115 and is configured to acquire and store one or more records 135 of the digitized I and Q baseband component information associated with the RF signal. In other words, the acquisition memory 130 receives the I and Q baseband component information from the digital downconverter 115 and stores it. In some embodiments, the digitized data output by the ADC 108 may be stored directly to a memory first, such as memory 130, and then accessed by the downconverter 115 to produce the I and Q baseband component information. Each input terminal 110 of the oscilloscope can have associated therewith a different portion of the acquisition memory 130 or a different record 135 in which the component information is stored. The acquisition memory 130 can be any variety of memory. For example, the acquisition memory 130 can be volatile memory, non-volatile memory, dynamic random-access memory, static memory, or the like.

The oscilloscope 100 includes a controller 140 that can be operatively coupled to the acquisition memory 130, and can access and/or process the I and Q baseband component information from the acquisition memory 130. The controller 140 can access and/or process the acquired data either during or subsequent to the actual acquisition of the data. The controller 140 is also coupled to the display unit 150 and produces corresponding waveforms for display by the display unit 150.

The controller 140 can include a trace generation section 145 and a search unit 147. The trace generation section 145 generates one or more IQ-based time-domain traces using the I and Q baseband component information. For example, after downconversion, the trace generation section 145 can generate a phase by calculating an arctangent of (Q divided by I), i.e., ARCTAN(Q/I). The trace generation section 145 can also generate a frequency by calculating a derivative with respect to time of the phase, i.e., d/dt (phase). The phase and the frequency are used to generate or plot phase-versus-time and frequency-versus-time traces, respectively. In addition, the trace generation section 145 can generate an amplitude (i.e., power-versus-time) trace, which can be generated, for example, by taking a square-root of the square of I added to the square of Q (e.g., SQRT($I^2+Q^2$)). The various traces will be further described in further detail below.

The search unit 147 can scan the IQ-based time-domain traces in the acquired record 135 for one or more events. For example, if the IQ-based time-domain trace is a frequency-versus-time trace, then the search unit 147 can locate and mark an event such as a runt or an illegal state in the frequency-versus-time trace. In addition, the search unit 147 can locate and mark events associated with individual traces of the I and Q baseband component information. In other words, the search unit can directly scan an individual trace (i.e., I-versus-time trace) of the I baseband component information, and/or directly scan an individual trace (i.e., Q-versus-time trace) of the Q baseband component information. As will be discussed in more detail below, a variety of IQ-based time-domain traces can be scanned for a variety of different kinds of events. An interval of interest at or around the one or more marked events can be displayed so that a user of the oscilloscope can efficiently locate and analyze the area of interest.

The display unit 150 is adapted to display the one or more IQ-based time-domain traces and the marked events, together (i.e., near to or overlapping with one another) with frequency-domain traces such as a spectrum of the RF signal and/or a spectrogram of the RF signal, within a same display of the display unit. The frequency-domain traces can be displayed and/or time-correlated together with the IQ-based time-domain traces in the same display, which allows the user to find events and then simultaneously view the events in both time and frequency domains; however, such a mixed display is not a requirement, and it should be understood that the IQ-based time-domain traces can be searched and marked independently of any frequency-domain traces, and visa versa.

The frequency-domain traces such as the spectrum and spectrogram of the RF signal are produced by the application of fast Fourier transform (FFT) algorithms to the I and Q data. When search results of the IQ-based time-domain traces are generated, the marked events can also be displayed within the same display of the display unit in a location that is conveniently viewable to a user of the oscilloscope. In other words, the IQ-based time-domain traces, the IQ-based frequency-domain traces, and the search results can be displayed near to one another, in a single display of the display unit 150.

Reference to the frequency-domain is made herein, and it should be understood that these refer to frequency-domain traces as understood by persons having skill in the art. For example, a spectrum of an RF signal is within the frequency-domain, and typically includes a plot having a horizontal axis representative of the frequency range, and a vertical axis representative of amplitude or signal power for a given frequency. In addition, a spectrogram of an RF signal is considered to be within the frequency-domain and typically includes a plot having a horizontal axis representative of the frequency range, a vertical axis representative of time, and the amplitude represented by varying colors of the trace.

Conversely, the time-domain includes different types of signals, and/or traces. For instance, a frequency-versus-time trace is understood to be within the time-domain rather than the frequency-domain, and is understood to have a horizontal axis representative of time, and a vertical axis representative of frequency.

Similar to frequency-versus-time, a power-versus-time trace shows how the power of a signal changes over time, and is understood to be within the time-domain; the horizontal axis is representative of time, and the vertical axis is representative of power—typically on a log scale instead of voltage on a linear scale. In addition, a phase-versus-time trace is displayed as a function of time, and is understood to be within the time-domain; the horizontal axis is representative of time, and the vertical axis is representative of the range of phase values. Reference is made herein to IQ-based time-domain traces, which refer to signals, and/or traces derived from I and Q component information, but within the time-domain, as contrasted with the frequency-domain.

Any of the ADC 108, the digital downconverter 115, the controller 140 including the search unit 147, and the display unit 150 may exist in or be implemented using hardware, software, firmware, or by any combination thereof.

FIG. 2A illustrates the search unit 147 of FIG. 1 having source data 205 of frequency-versus-time, and the digitized record(s) 135 including a variety of time-domain events that are scanned and identified by the search unit 147.

The trace generation section 145 generates a frequency-versus-time trace using the I and Q baseband component information. The search unit 147 locates and marks one or more events in the frequency-versus-time trace. For instance, the search unit 147 can locate and mark a runt 210 in the frequency-versus-time trace, or in other words, an irregular positive or negative pulse in the frequency-versus-time trace that enters and exits predefined amplitude thresholds. As another example, the search unit 147 is configured to locate and mark one or more window events 220 in which the frequency-versus-time trace enters or exits a predefined window. The window can be defined by first and second thresholds.

In some example embodiments, the search unit 147 scans the records for one or more frequency burst width events 240; that is, where a width of a burst of signal activity within a given frequency is located and marked. More than one RF signal can be acquired and stored, each of which can be scanned for one or more frequency burst width events associated with the RF signals. Once the frequency burst width events 240 have been located and marked, they can be displayed on the display unit 150.

In some example embodiments, the search unit 147 is configured to locate and mark other types of events in the IQ-based time-domain traces such as a pulse width or glitch event 215 in which a pulse width of a pulse of the frequency-versus-time trace is less than or greater than a given threshold, a logic event 235 in which an aspect of the frequency-versus-time trace coincides with predefined multi-channel logic criteria, a slew rate event 230 in which a slew rate of the frequency-versus-time trace is less than or greater than predefined limits, or an edge event 225 in which an edge of the frequency-versus-time trace is found or otherwise conforms to a given criteria such as the beginning or ending of an RF frequency shift, among other suitable events.

FIG. 2B illustrates a simplified display 200 including a frequency-versus-time trace 255/260, together with a spectrogram 285 and/or a spectrum 290 of RF signals received by a test and measurement instrument, in accordance with an example embodiment of the invention.

As illustrated in FIG. 2B, the upper portion of display 200 includes frequency-versus-time trace 255 and several markers 250. The markers 250 indicate locations within the frequency-versus-time trace 255 in which events were found.

The display 200 can include a zoom window 245 in which a portion 260 of the frequency-versus-time trace 255 is enhanced and/or enlarged so that particular features of the waveforms can be more readily inspected by the user of the oscilloscope.

Generally, the zoom window 245 will include a marker 252 corresponding to at least one of the markers 250 identifying the located event(s) in the acquired record. The marker 252 marks the portion or interval of interest in the frequency-versus-time trace 260 having the event. For instance, FIG. 2B shows a runt event 265 located and marked in the frequency-versus-time trace portion 260, which corresponds to an incorrect frequency hop of the frequency-versus-time trace 255. The limits or parameters of what constitutes an incorrect frequency hop, or any of the other events, is configurable by the user of the oscilloscope. Any of the events discussed above can be located and marked by the search unit 147 in a similar fashion.

Moreover, a spectrogram 285 and/or a spectrum 290 in the frequency-domain can be displayed together (i.e., near to or overlapping with one another) with the frequency-versus-time trace in the time-domain, and together with the markers, in a single display 200 of the display unit 150. In other words, the spectrogram 285 and spectrum 290 are not displayed in separate displays, which would otherwise make it difficult to correlate information between the signals. Rather, information from the spectrogram 285 and/or spectrum 290 in the frequency-domain can be time-correlated with information from the time-domain traces such as the frequency-versus-time trace 255/260 and markers within the same display.

In some embodiments, the search unit 147 can automatically scan and locate, within the acquired records, a plurality of events in the frequency-versus-time trace responsive to a selection by the user, and automatically display the frequency-versus-time trace and associated markers on the display 200 for further analysis by the user. It should be understood that any of the search and marking techniques discussed above can be automatically applied to a variety of events in the identified IQ-based time-domain traces, and displayed by the oscilloscope 100.

Figure 3A:
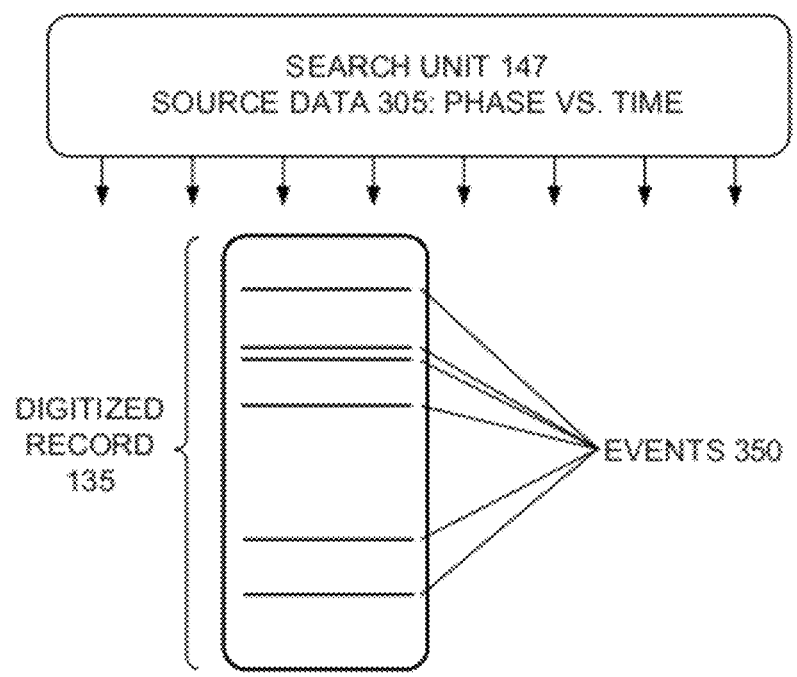
FIG. 3A illustrates the search unit of FIG. 1 having source data of phase-versus-time, and a digitized record(s) including a variety of time-domain events that are scanned and identified by the search unit.

FIG. 3A illustrates the search unit 147 of FIG. 1 having source data of phase-versus-time 305, and a digitized record(s) 135 including a variety of time-domain events 350 that are scanned and identified by the search unit 147.

The trace generation section 145 generates a phase-versus-time trace using the I and Q baseband component information. The search unit 147 locates and marks one or more events 350 in the phase-versus-time trace. For instance, the search unit 147 can locate and mark events which may be similar to or otherwise correspond to events described above, but applied to the phase-versus-time trace 360.

Figure 3B:
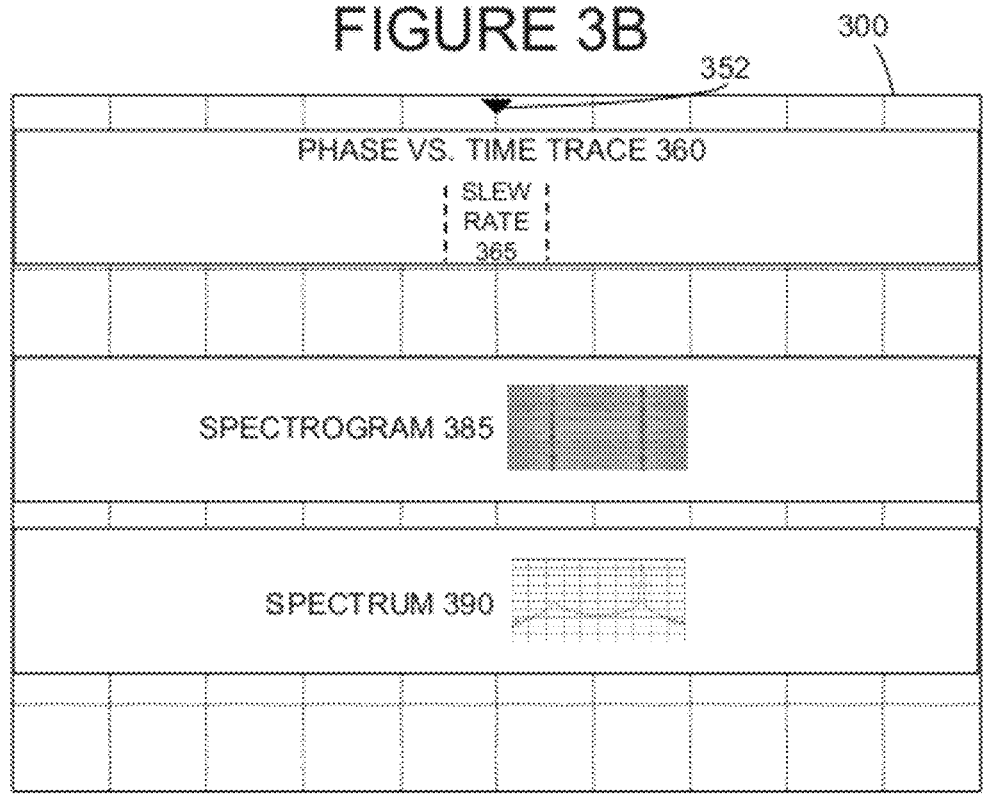
FIG. 3B illustrates a simplified display including a phase-versus-time trace, together with a spectrogram and/or a spectrum of RF signals received by a test and measurement instrument, in accordance with an example embodiment of the invention.

As illustrated in FIG. 3B, the upper portion of display 300 includes phase-versus-time trace 360 and marker 352. The marker 352 can be one of several markers (not shown), which indicate locations within the phase-versus-time trace 360 in which events were found.

Although the display 300 does not show a zoom window such as 245, it should be understood that such a zoom window can be included so that portions of the phase-versus-time trace 360 can be enhanced and/or enlarged, and therefore, more readily inspected by the user of the oscilloscope.

As previously mentioned, the marker 352 identifies the located event(s) in the acquired record. The marker 352 marks the portion or interval of interest in the phase-versus-time trace 360 having the event. For instance, FIG. 3B shows a slew rate event 365 located and marked in the phase-versus-time trace 360. The slew rate event 365 can indicate, for example, a location in which a modulated signal took too much time to move from one phase to another. The limits or parameters of what constitutes a slew rate event, or any of the other events, is configurable by the user of the oscilloscope. Any of the events discussed above can be located and marked by the search unit 147 in a similar fashion.

Moreover, a spectrogram 385 and/or a spectrum 390 in the frequency-domain can be displayed together (i.e., near to or overlapping with one another) with the phase-versus-time trace in the time-domain, and together with the markers, in a single display 300 of the display unit 150. In other words, the spectrogram 385 and spectrum 390 are not displayed in separate displays, which would otherwise make it difficult to correlate information between the signals. Rather, information from the spectrogram 385 and/or spectrum 390 in the frequency-domain can be time-correlated with information from the time-domain traces such as the phase-versus-time trace 360 and markers within the same display.

In some embodiments, the search unit 147 can automatically scan and locate, within the acquired records, a plurality of events 350 in the phase-versus-time trace responsive to a selection by the user, and automatically display the phase-versus-time trace and associated markers on the display 300 for further analysis by the user. It should be understood that any of the search and marking techniques discussed above can be automatically applied to a variety of events in the identified IQ-based time-domain traces, and displayed by the oscilloscope 100.

Figure 4A:
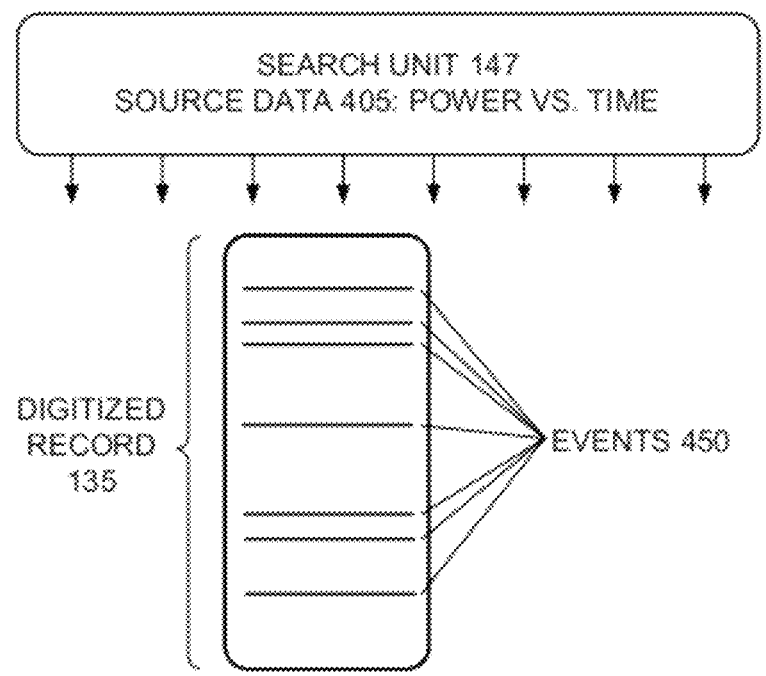
FIG. 4A illustrates the search unit of FIG. 1 having source data of power-versus-time, and a digitized record(s) including a variety of time-domain events that are scanned and identified by the search unit.

FIG. 4A illustrates the search unit 147 of FIG. 1 having source data of power-versus-time 405, sometimes referred to as an amplitude trace, and a digitized record(s) 135 including a variety of time-domain events 450 that are scanned and identified by the search unit 147.

The trace generation section 145 generates a power-versus-time trace using the I and Q baseband component information. The search unit 147 locates and marks one or more events 450 in the power-versus-time trace. For instance, the search unit 147 can locate and mark events which may be similar to or otherwise correspond to events described above, but applied to the power-versus-time trace 460.

Figure 4B:
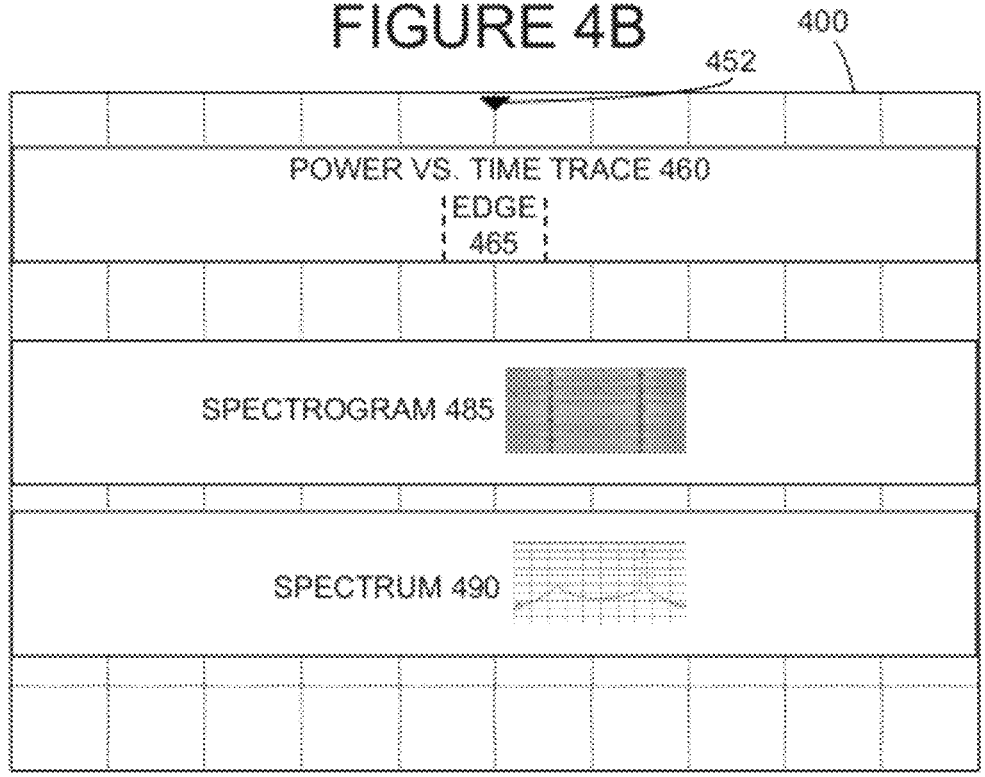
FIG. 4B illustrates a simplified display including a power-versus-time trace, together with a spectrogram and/or a spectrum of RF signals received by a test and measurement instrument, in accordance with an example embodiment of the invention.

As illustrated in FIG. 4B, the upper portion of display 400 includes power-versus-time trace 460 and marker 452. The marker 452 can be one of several markers (not shown), which indicate locations within the power-versus-time trace 460 in which events were found.

Although the display 400 does not show a zoom window such as 245, it should be understood that such a zoom window can be included so that portions of the power-versus-time trace 460 can be enhanced and/or enlarged, and therefore, more readily inspected by the user of the oscilloscope.

As previously mentioned, the marker 452 identifies the located event(s) in the acquired record. The marker 452 marks the portion or interval of interest in the power-versus-time trace 460 having the event. For instance, FIG. 4B shows an edge event 465 located and marked in the power-versus-time trace 460 in which an edge of an RF burst is found. The limits or parameters of what constitutes an edge event, or any of the other events, is configurable by the user of the oscilloscope. Any of the events discussed above can be located and marked by the search unit 147 in a similar fashion.

Moreover, a spectrogram 485 and/or a spectrum 490 in the frequency-domain can be displayed together (i.e., near to or overlapping with one another) with the power-versus-time trace in the time-domain, and together with the markers, in a single display 300 of the display unit 150. In other words, the spectrogram 485 and spectrum 490 are not displayed in separate displays from the other signals, which would otherwise make it difficult to correlate information between the signals. Rather, information from the spectrogram 485 and/or spectrum 490 in the frequency-domain can be time-correlated with information from the time-domain traces such as the power-versus-time trace 460 and markers within the same display.

In some embodiments, the search unit 147 can automatically scan and locate, within the acquired records, a plurality of events 450 in the power-versus-time trace responsive to a selection by the user, and automatically display the power-versus-time trace and associated markers on the display 400 for further analysis by the user. It should be understood that any of the search and marking techniques discussed above can be automatically applied to a variety of events in the identified IQ-based time-domain traces, and displayed by the oscilloscope 100.

It should be understood that the embodiments and techniques illustrated and described with reference to FIGS. 2A, 2B, 3A, 3B, 4A, and 4B can be applied to individual traces of the I and Q baseband component information. In other words, the search unit can directly scan an individual trace (i.e., I-versus-time trace) of the I baseband component information, and/or directly scan an individual trace (i.e., Q-versus-time trace) of the Q baseband component information. The display unit can then display intervals of interest at or around the marked events in the I-versus-time trace or the Q-versus-time trace, or both.

FIG. 5 is a flow diagram illustrating a technique for searching events in IQ-based time-domain traces according to some embodiments of the invention. The technique begins at 505 where an electrical signal such as an RF signal or an analog signal is received at a terminal of a test and measurement instrument such as an oscilloscope. The ADC is used to digitize the electrical signal at 510. The flow then proceeds to 515 where the digitized signals are downconverted to produce I and Q baseband component information. At 520, one or more records is produced in an acquisition memory in which the IQ baseband component information and related data are stored. The record(s) are searched at 525 for one or more events associated with the IQ-based time-domain traces. A determination is made at 530 whether one or more events are located in the record. If NO, the flow proceeds through circle 'A' and the process repeats. Otherwise, the flow proceeds to 535, and the located events are marked in the IQ-based time-domain traces. The flow then proceeds to 540 where the interval of interest at or around the marked events in the IQ-based time-domain traces are displayed on a display unit of the oscilloscope for observation and analysis by the user.

Although particular embodiments have been described, it will be appreciated that the principles of the invention are not limited to those embodiments. For example, while the embodiments mentioned above describe different properties of waveforms, the properties described do not tend to be statistical like the properties associated with jitter measurements or information; however, the embodiments disclosed are not limited to non-statistical properties, but rather, can extend to jitter information and the like or other types of statistical information. Moreover, demodulated data, including bits and symbols, can also be searched, located, and marked using techniques similar to those described above.

In some embodiments, an article drawn from the set including floppy disks, optical disks, fixed disks, volatile memory, non-volatile memory, random access memory, read-only memory, or flash memory, comprising a machine-accessible medium having associated instructions that, when executed in a test and measurement device, results in a machine performing the steps of the various embodiments of the invention as disclosed herein. Other variations and modifications may be made without departing from the principles of the invention as set forth in the following claims.

What is claimed is:

1. A test and measurement instrument, comprising:
    an input terminal configured to receive a radio frequency signal under test;

an analog-to-digital converter (ADC) configured to digitize the signal under test;

a digital downconverter configured to produce I (in-phase) and Q (quadrature) baseband component information from the digitized signal;

an acquisition memory configured to store one or more records of the digitized I and Q baseband component information associated with the digitized signal;

a trace generation section configured to generate one or more types of IQ-based time-domain data using the I and Q baseband component information stored in the acquisition memory, generate one or more IQ-based time-domain traces based on the IQ-based time-domain data, and generate individual traces of the I and Q baseband component information; and a search unit configured to scan the one or more types of IQ-based time-domain data generated using the I and Q baseband component information stored in the acquisition memory for one or more events and directly scan the individual trace of the I baseband component information or the individual trace of the Q baseband component information for one or more events.

2. The test and measurement instrument of claim 1, wherein:

the search unit is configured to locate and mark the one or more events in the one or more IQ-based time-domain traces.

3. The test and measurement instrument of claim 1, further comprising a display unit adapted to display an interval of interest at or around the one or more events.

4. The test and measurement instrument of claim 1, wherein:

the one or more IQ-based time-domain traces include a frequency-versus-time trace;

the search unit is configured to locate and mark the one or more events in the frequency-versus-time trace; and the display unit is adapted to display the interval of interest at or around the one or more marked events in the frequency-versus-time trace.

5. The test and measurement instrument of claim 1, wherein:

the one or more IQ-based time-domain traces include a phase-versus-time trace;

the search unit is configured to locate and mark the one or more events in the phase-versus-time trace; and the display unit is adapted to display the interval of interest at or around the one or more events in the phase-versus-time trace.

6. The test and measurement instrument of claim 1, wherein:

the one or more IQ-based time-domain traces include a power-versus-time trace;

the search unit is configured to locate and mark the one or more events in the power-versus-time trace; and the display unit is adapted to display the interval of interest at or around the one or more events in the power-versus-time trace.

7. The test and measurement instrument of claim 1, wherein the search unit is configured to scan the one or more records for one or more events in which the one or more IQ-based time-domain traces jump to an illegal state.

8. A method of searching for events in IQ-based time-domain traces, the method comprising:

receiving a radio frequency signal under test at a terminal of an oscilloscope;

digitizing the signal under test using an analog-to-digital converter (ADC);

downconverting the digitized signal and producing I (in-phase) and Q (quadrature) baseband component information;

acquiring and storing a record of the I and Q baseband component information associated with the signal in an acquisition memory;

generating one or more types of IQ-based time-domain data using the I and Q baseband component information stored in the acquisition memory;

generating one or more IQ-based time-domain traces based on the IQ-based time-domain data including generating individual traces of the I and Q baseband component information;

searching the one or more types of IQ-based time-domain data generated using the I and Q baseband component information stored in the acquisition memory for one or more events including directly scanning the individual trace of the I baseband component information or the individual trace of the Q baseband component information for one or more events;

marking the one or more events; and displaying an interval of interest at or around the one or more marked events associated with the one or more IQ-based time-domain traces.

9. The method of claim 8, wherein the one or more IQ-based time-domain traces include a frequency-versus-time trace.

10. The method of claim 9, wherein searching further includes:

searching the frequency-versus-time trace for the one or more events;

marking the one or more events in the frequency-versus-time trace; and displaying the interval of interest at or around the one or more marked events in the frequency-versus-time trace.

11. The method of claim 8, wherein the one or more IQ-based time-domain traces include a phase-versus-time trace.

12. The method of claim 11, wherein searching further includes:

searching the phase-versus-time trace for the one or more events;

marking the one or more events in the phase-versus-time trace; and displaying the interval of interest at or around the one or more marked events in the phase-versus-time trace.

13. The method of claim 8, wherein the one or more IQ-based time-domain traces include a power-versus-time trace.

14. The method of claim 13, wherein searching further includes:

searching the power-versus-time trace for the one or more events;

marking the one or more events in the power-versus-time trace; and displaying the interval of interest at or around the one or more marked events in the power-versus-time trace.

15. The method of claim 8, wherein the one or more IQ-based time-domain traces include demodulated data.

16. The method of claim 15, wherein searching further includes:

searching the demodulated data for the one or more events;

marking the one or more events in the demodulated data; and displaying the interval of interest at or around the one or more marked events in the demodulated data.

17. An article drawn from the set including floppy disks, optical disks, fixed disks, volatile memory, non-volatile memory, random access memory, read-only memory, or flash memory, comprising a machine-accessible medium having associated instructions that, when executed in a test and measurement device, results in a machine performing the steps of claim 8.

* * * * *